(12) United States Patent
Ayotte et al.

(10) Patent No.: US 8,230,903 B2
(45) Date of Patent: Jul. 31, 2012

(54) LOW PROFILE HEAT SINK FOR SEMICONDUCTOR DEVICES

(75) Inventors: Stephen P. Ayotte, Bristol, VT (US); David J. Hill, Richmond, VT (US); Kristen L. Holverson, Williston, VT (US); Christina M. Pepi, Underhill, VT (US); Timothy M. Sullivan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1139 days.

(21) Appl. No.: 12/105,478

(22) Filed: Apr. 18, 2008

(65) Prior Publication Data

US 2009/0260778 A1    Oct. 22, 2009

(51) Int. Cl.
*F28F 7/02* (2006.01)
(52) U.S. Cl. ........................ 165/80.3; 165/147
(58) Field of Classification Search ............... 165/80.2, 165/80.3, 146, 147
See application file for complete search history.

(56) References Cited

U.S. PATENT DOCUMENTS

| | | | |
|---|---|---|---|
| 5,437,328 A * | 8/1995 | Simons | 165/146 |
| 6,180,874 B1 | 1/2001 | Brezina et al. | |
| 7,315,450 B2 | 1/2008 | Ishii et al. | |
| 2007/0053168 A1 * | 3/2007 | Sayir et al. | 361/718 |
| 2007/0074856 A1 * | 4/2007 | Bhatti et al. | 165/104.33 |

* cited by examiner

*Primary Examiner* — Teresa Walberg
(74) *Attorney, Agent, or Firm* — Wood, Herron & Evans, LLP; Anthony J. Canale

(57) ABSTRACT

A heat sink for cooling a heat-generating device includes a base and a cooling section coupled thereto for cooling the device. The cooling section includes a plurality of flow tubes, each flow tube having an inlet, an outlet, and a bounding wall that defines a closed fluid flow path from the inlet to the outlet. Each of the flow tubes includes a central axis that is substantially parallel to a reference plane of the heat-generating device. The flow tubes may be arranged in a layered stack and include a bounding wall that has a thickness that decreases with increasing distance in the layered stack. The flow tubes may also include a cross-sectional area that decreases with increasing distance in the layered stack. Furthermore, the bounding wall of the flow tubes may have a non-planar configuration in a direction generally parallel to the central axis.

6 Claims, 2 Drawing Sheets

LOW PROFILE HEAT SINK FOR SEMICONDUCTOR DEVICES

TECHNICAL FIELD

The invention relates to cooling heat-generating components and, more particularly, to a heat sink having a low profile to adequately cool a semiconductor device, such as a microprocessor.

BACKGROUND

As the power levels of microprocessors and other electronic components continue to increase to provide higher levels of performance, the task of cooling these microprocessors as they operate becomes more of a challenge. As illustrated in FIG. 1, one conventional approach to cooling microprocessors includes mounting a heat sink to the microprocessor and forcing air over the heat sink to effectuate cooling thereof. The conventional heat sink 10 typically includes a base 12 mounted to the microprocessor 14 and a plurality of generally planar fins 16 projecting from base 12 in a substantially perpendicular manner. More particularly, the fins 16 are generally configured as rectangular bars or plates in spaced apart relation across a length of base 12 to define flow channels 18 therebetween. Air from a fan (not shown), for example, is directed into the flow channels 18 so as to flow across the major surfaces of the fins 16 and provide cooling to microprocessor 14.

While such conventional heat sinks as described above are common, there are some drawbacks to their use in some applications for which cooling of microprocessors is desired. For example, one such drawback is that conventional heat sinks are relatively large in size in order to provide adequate cooling of the microprocessor. In some applications, however, the amount of space within a cabinet, housing, or other enclosure about the microprocessor is very limited and providing adequate cooling becomes a major design challenge. It is believed that the relatively large size of conventional heat sinks 10 may be due to an inefficient use of the available surface area and the fluid flowing through the flow channels 18. In this regard, and as illustrated in FIG. 1, the flow channels 18 are typically open along an upper end 20 thereof. Thus, as air is directed into the flow channels 18, as illustrated by arrows A, the air is heated and starts to rise and flow out of the upper end 20 of the heat sink 10, as illustrated by arrows B. Accordingly, a relatively low volume of air flows across the full extent (e.g., width) of the fins 16 so as to exit the end opposite the air inlet. Therefore, the surface area of the fins 16 adjacent the exit end of the flow channels 18 is not efficiently utilized to effectuate heat transfer from the microprocessor 14. In addition, the planar sides of the fins 16 facilitate generally smooth, laminar type flow through the channels 18, which may reduce the amount of heat transfer compared to a more chaotic, turbulent flow pattern.

Accordingly, there is a need for an improved heat sink that makes more efficient use of the available surface area and air flowing therethrough so as to permit a relatively smaller, low profile design capable of providing adequate cooling to the microprocessor.

SUMMARY

An embodiment of the invention that addresses these and other drawbacks provides a heat sink for cooling a heat-generating device having a definable reference plane. The heat sink includes a base for mounting to the heat-generating device and a cooling section coupled thereto for cooling the device. The cooling section includes a plurality of flow tubes, each flow tube having an inlet, an outlet, and a bounding wall that defines a substantially closed fluid flow path from the inlet to the outlet. Each of the flow tubes includes a central axis defining a direction along which fluid generally flows that is substantially parallel to the reference plane of the heat-generating device.

In one embodiment, the bounding walls may have a hexagonal shape although other shapes, including triangular, square, rectangular, pentagonal, octagonal, circular, or other suitable shapes, may also be used. The flow tubes of the heat sink may be arranged in a layered stack and include a bounding wall that has a thickness that decreases with increasing distance of the flow tube in the layered stack. Moreover, the flow tubes of the heat sink may include a cross-sectional area that also decreases with increasing distance of the flow tube in the layered stack. In still a further embodiment, the bounding wall of the flow tubes may have a non-planar configuration or topography in a direction generally parallel to the central axis. For example, the bounding walls may be sawtoothed, step shaped or sinusoidal in this direction.

These and other objects, advantages and features of the invention will become more readily apparent to those of ordinary skill in the art upon review of the following detailed description taken in conjunction with the accompanying drawings.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 2:
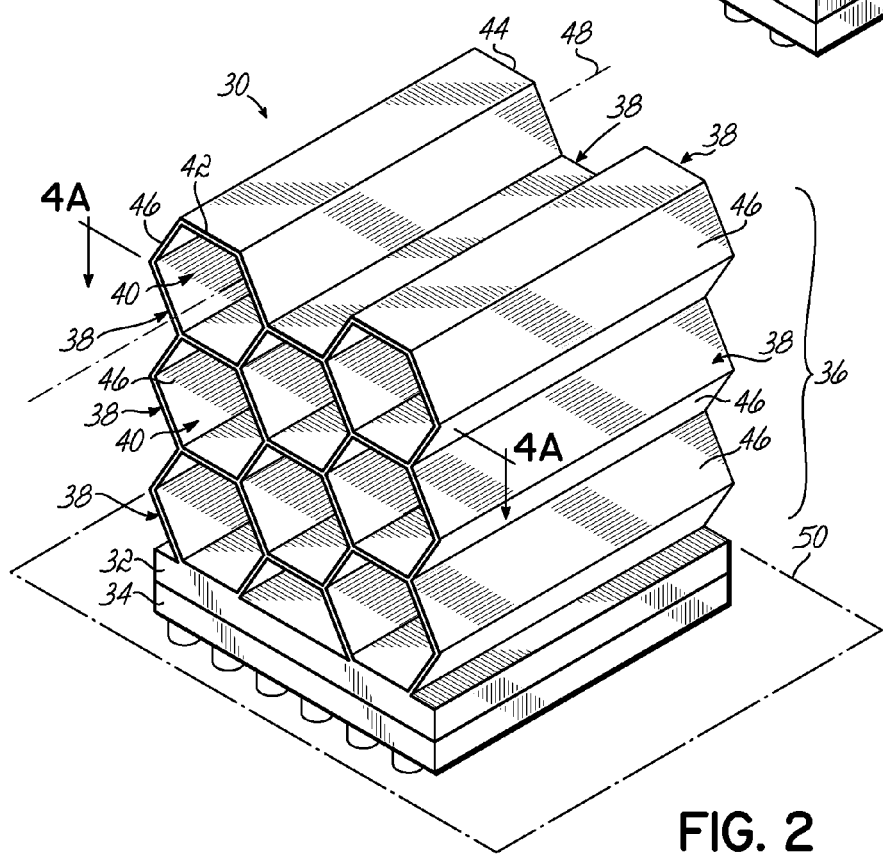
FIG. 2 is a perspective view of a heat sink in accordance with an embodiment of the invention.

With reference to FIG. 2, an exemplary heat sink 30 in accordance with aspects of the invention is illustrated that overcomes many of the drawbacks and disadvantages of conventional heat sinks. Heat sink 30 includes a base 32 for mounting to a heat-generating device, such as microprocessor 34, and a cooling section, generally illustrated at 36, for facilitating cooling of the microprocessor 34. While the heat-generating device is described herein as a microprocessor, those of ordinary skill in the art will recognize that other devices, including other semiconductor devices, may benefit from aspects of the invention. The heat sink 30 is therefore not limited in use to microprocessor 34, but may be used with other heat-generating devices as well. In one aspect, the cooling section 36 includes a plurality of discrete flow tubes 38 that each define a closed fluid flow path 40 for a working fluid, such as air, to provide cooling to the microprocessor 34. For example, a fan or other fluid flow generator (not shown) may be used to establish a flow of fluid through the flow tubes 38 and thus effectuate heat transfer from microprocessor 34. In one embodiment, the flow tubes 38 may be arranged in a layered stack in a direction generally away from the microprocessor 34.

Each of the fluid flow tubes 38 includes a fluid inlet 42, a fluid outlet 44, and a bounding wall 46 having at least one surface that defines the fluid flow path 40. But for the open fluid inlet and outlet 42, 44, the bounding wall 46 substantially encloses the flow path 40 (e.g., along its periphery) such that the fluid flow through heat sink 30 is via flow through the plurality of discrete flow tubes 38. In other words, fluid flow within any one of the flow tubes 38 remains confined within that particular flow tube and any cross flow between adjacent flow tubes is substantially restricted. The flow tubes 38 include a central axis 48 that generally defines the direction of fluid flow along flow path 40. In one embodiment, the central axis 48 is generally parallel to a plane 50 defined by the microprocessor 34. For example, the plane 50 may be defined by an outer surface of the microprocessor 34 to which the base 32 of heat sink 30 is mounted. Those of ordinary skill in the art will recognize other planes which may be defined so as to orient the flow tubes 38 generally parallel to such a plane. In an alternate embodiment, the central axis 48 of the flow tubes 38 may form an acute angle relative to the plane 50 so that the flow tubes 38 are generally inclined relative to the plane 50.

Configuring the cooling section 36 into a plurality of discrete flow tubes 38 may provide some advantages not heretofore appreciated relative to conventional heat sink design. By way of example, because the flow tubes 38 are closed along their periphery, the fluid flow that is directed into the flow tubes 38, such as from a fan, traverses the entire extent or width of the flow tube 38 and is not permitted to escape from an open upper end of the heat sink, as is observed in conventional heat sinks. Accordingly, the surface area of the flow tubes 38 adjacent the fluid exit 44 is used more efficiently to transfer heat to the air or other working fluid flowing therethrough. Moreover, because the available surface area is being utilized in a more efficient manner, the heat sink 30 may be reduced in size relative to more conventional heat sink designs to transfer the amount of heat necessary to adequately cool the microprocessor 34. In other words, forcing the working fluid to traverse substantially the full extent of the flow tubes 38 provides for a more efficient use of surface area and allows for a more compact, low profile design to the heat sink 30.

The bounding wall 46 of the flow tubes 38 may have one of several different geometrical shapes in accordance with aspects of the invention. For example, as shown in FIG. 2, the bounding wall 46 of each of the flow tubes 38 may have a hexagonal shape. The invention, however, is not so limited as the bounding wall 46 of the flow tubes 38 may have other polygonal shapes including triangular, quadrilateral (e.g., rectangular, square, etc.), pentagonal, octagonal, etc. Alternatively, the bounding wall 46 of the flow tubes 38 may be circular or have some other irregular geometrical shape. Those of ordinary skill in the art may recognize other geometrical shapes within the scope of the embodiments of the invention.

Figure 3:
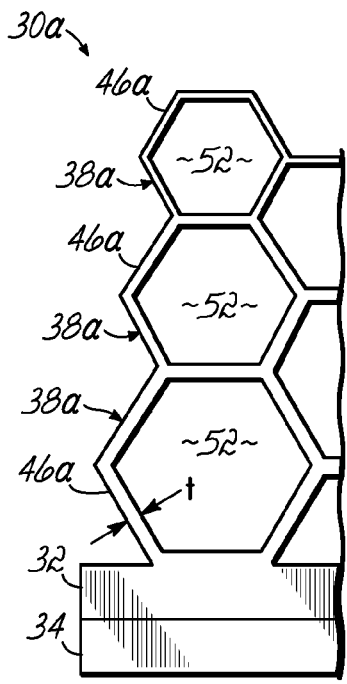
FIG. 3 is a front partial view of an alternate embodiment of a heat sink similar to that shown in FIG. 2.

In addition to the plurality of flow tubes 38, embodiments of a heat sink may include additional features that promote a compact, low profile design. For example, as shown in FIG. 3, in which like reference numerals refer to like features shown in FIG. 2, heat sink 30a includes bounding walls 46a that vary in thickness, t, as a function of distance away from the microprocessor 34 or other heat-generating device (e.g., with increasing distance in the layered stack). In this regard, the heat transfer to the air or other working fluid flowing through the flow tubes 38a is highest near the microprocessor 34 and decreases in a direction away from microprocessor 34, such as in a direction substantially perpendicular to microprocessor 34. Accordingly, the thickness t of the bounding walls 46a of the flow tubes 38a may be highest near the microprocessor 34 and decrease in thickness in a direction away from microprocessor 34 (e.g., either within an individual flow tube or along the layered stack of flow tubes). In one embodiment, for example, the bounding walls 46a of the flow tubes 38a adjacent base 32 may have a thickness of about 5 mm, and the bounding walls 46a of the flow tubes 38a furthest from base 32 may have a thickness of about 1 mm. These values are only exemplary and those of ordinary skill in the art will recognize how to determine the variation in thickness of the bounding walls 46a as a function of distance from the microprocessor 34 to meet the requirements of a specific application.

FIG. 3 illustrates a further feature which may allow a heat sink to be made in a more compact, low profile manner. In this regard, the bounding walls 46a of each of the flow tubes 38a may define a cross-sectional area 52 (which in turn defines the surface area for heat transfer). In one embodiment, the cross-sectional area 52 of the flow tubes 38a may vary as a function of distance away from the microprocessor 34 or other heat-generating device (e.g., with increasing distance in the layered stack). In a similar manner as described above, the heat transfer to the air or other working fluid flowing through the flow tubes 38a is highest near the microprocessor 34 and decreases in a direction away from microprocessor 34, such as in a direction substantially perpendicular to microprocessor 34. Accordingly, the cross-sectional area 52 of the flow tubes 38a, and therefore the available surface area for convecting heat therefrom, may be highest near the microprocessor 34 and decrease in a direction away from microprocessor 34. In one embodiment, for example, the flow tubes 38a adjacent base 32 may have a cross-sectional area 52 of about 2.6 cm$^2$, and the flow tubes 38a furthest from base 32 may have a cross-sectional area 52 of about 0.16 cm$^2$. These values are only exemplary and those of ordinary skill in the art will recognize how to determine the variation in the cross-sectional area of the flow tubes 38a as a function of distance from the microprocessor 34 to meet the requirements of a specific application.

Figure 1:
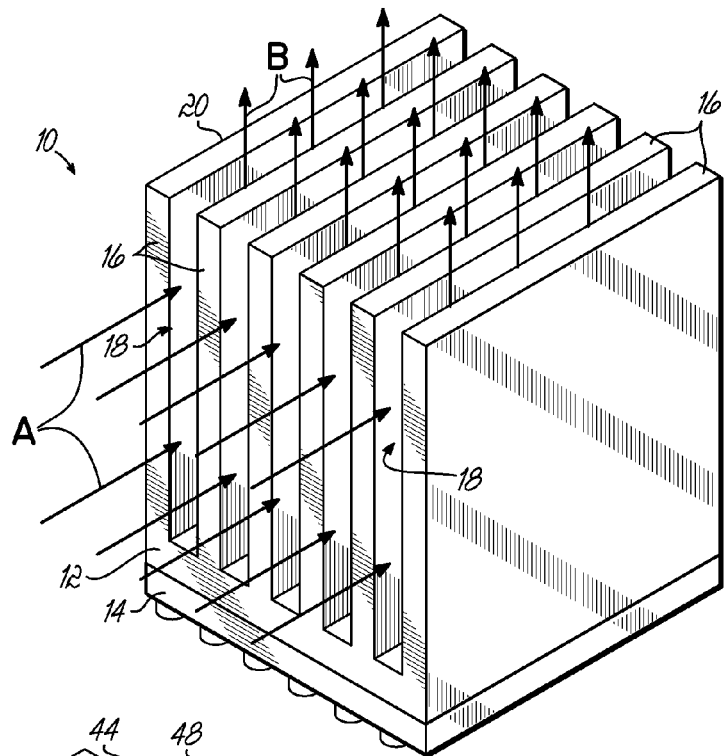
FIG. 1 is a perspective view of a conventional heat sink design.
Figure 4A:
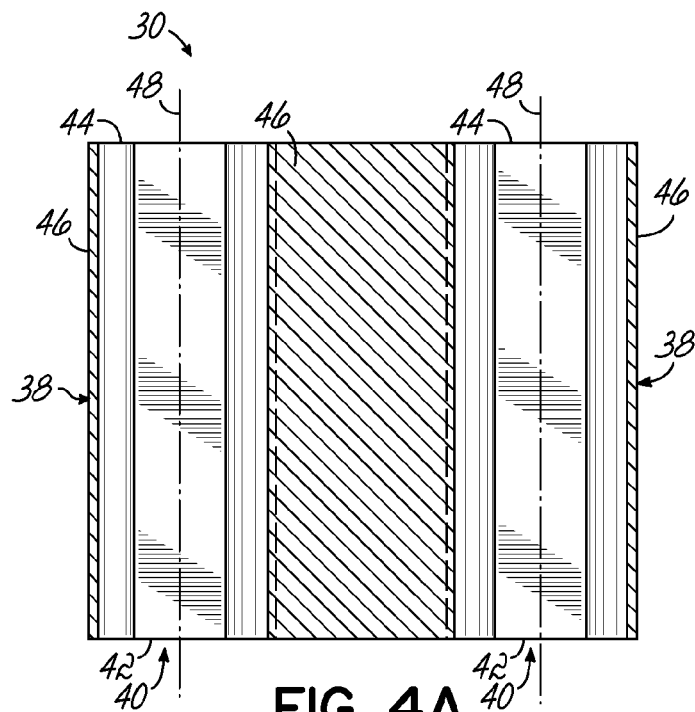
FIG. 4A is a top cross-sectional view of the heat sink shown in FIG. 2 taken along line 4A-4A.
Figure 4B:
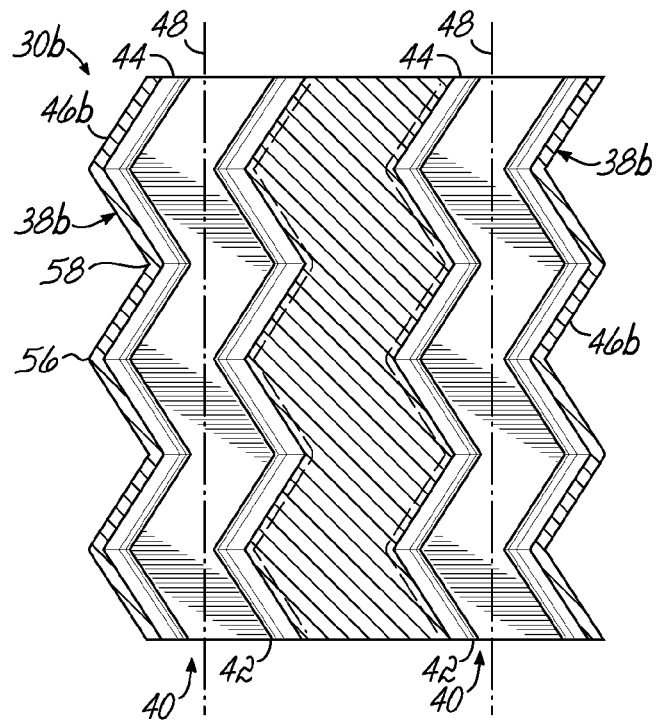
FIG. 4B is a top cross-sectional view of an alternate embodiment of a heat sink similar to that shown in FIG. 4A.

Heat sinks in accordance with aspects of the invention may include other features that allow a heat sink to have a compact, low profile design. In conventional heat sinks, the walls that form the flow channels 18 are generally planar in a direction generally parallel to the initial fluid flow direction (i.e., in a direction parallel to arrow A in FIG. 1). As shown in FIG. 4A, heat sink 30 shown in FIG. 2 also has bounding walls 46 that are generally planar in a direction generally parallel to the central axis 48 of flow tubes 38. However, in an alternative embodiment, and as illustrated in FIG. 4B, a heat sink 30b may include bounding walls 46b that are non-planar in a direction substantially parallel to the central axis 48 (and the general direction of flow through flow tubes 38b). For example, the bounding walls 46b may have a sawtooth or zig-zag topography generally defining a plurality of crests 56 and troughs 58 in a direction substantially parallel to central axis 48. While a sawtooth topography is illustrated in FIG. 4B, the invention is not so limited. Those of ordinary skill in the art will recognize other non-planar topographies with raised or recessed features which may be used in embodiments of the invention. By way of example, the bounding walls 46b may be sinusoidal, step shaped, or have some other topography that generally defines a plurality of crests and troughs.

By making the bounding walls 46b non-planar in the flow direction, the fluid flow may be essentially tripped or disturbed so as to result in turbulent type flow conditions instead of the smooth, laminar type of flow facilitated by smooth bounding walls. Accordingly, heat transfer from the surface of the flow tubes 38b may be enhanced due to the more chaotic, turbulent flow therethrough. Additionally, the non-planar topography provides increased surface area relative to a planar configuration for which to transfer heat.

By virtue of the foregoing, an improved, low profile heat sink is provided. The heat sink includes a cooling section configured as a plurality of discrete, closed flow tubes that force the fluid flow to traverse the full extent of the heat sink instead of allowing the fluid flow to exit from an open upper end thereof. Additionally, the thickness of the bounding walls or a cross-sectional area of the flow tubes may decease in a direction away from the microprocessor or other heat-generating device. Furthermore, the bounding walls may be non-planar in the direction of fluid flow so as to increase the effective surface area for heat transfer as well as to encourage turbulent fluid flow conditions in the flow tubes. One or more of these features provide more efficient heat transfer from the heat sink, thus allowing the heat sink to have a more compact, low profile design relative to conventional heat sinks. Such low profile heat sinks may be desirable in applications having significant space restrictions.

While the present invention has been illustrated by a description of various preferred embodiments and while these embodiments have been described in some detail, it is not the intention of the Applicants to restrict or in any way limit the scope of the appended claims to such detail. Additional advantages and modifications will readily appear to those skilled in the art. Thus, the various features of the invention may be used alone or in numerous combinations depending on the needs and preferences of the user.

What is claimed is:

1. A heat sink for cooling a heat-generating device including a reference plane, comprising:
    a base for mounting to the heat-generating device; and
    a cooling section coupled to the base, the cooling section including a plurality of discrete flow tubes, each discrete flow tube having an inlet, an outlet, and a bounding wall that defines a closed fluid flow path from the inlet to the outlet, and each discrete flow tube including a central axis along which fluid flows that is substantially parallel to the reference plane of the heat-generating device,
    wherein the discrete flow tubes are arranged in a layered stack, the bounding wall of each discrete flow tube has an octagonal geometrical shape viewed along the central axis, the bounding wall of each flow tube has a thickness that decreases with increasing distance of the discrete flow tube in the layered stack relative to the reference plane, and the bounding wall of each discrete flow tube has a sawtooth topography generally defining a plurality of crests and a plurality of troughs in a direction substantially parallel to the central axis.

2. The heat sink of claim 1, wherein the flow tubes are arranged in a layered stack and each flow tube includes a cross-sectional area that decreases with increasing distance of the flow tube in the layered stack.

3. The heat sink of claim 1 wherein each layer of the layered stack includes an equal number of discrete flow tubes.

4. The apparatus of claim 1 wherein each layer of the layered stack includes an equal number of discrete flow tubes.

5. An apparatus, comprising:
    a microprocessor including an outer surface defining a reference plane; and
    a heat sink including a base coupled to the outer surface of the microprocessor, and a cooling section coupled to and extending from the base and including a plurality of discrete flow tubes, each discrete flow tube having an inlet, an outlet, and a bounding wall that defines a closed fluid flow path from the inlet to the outlet and having a central axis,
    wherein the discrete flow tubes are arranged in a layered stack, the bounding wall of each discrete flow tube has an octagonal geometrical shape viewed along the central axis, the bounding wall of each discrete flow tube has a thickness that decreases with increasing distance of the discrete flow tube in the layered stack relative to the reference plane, and the bounding wall of each discrete flow tube has a sawtooth topography generally defining a plurality of crests and a plurality of troughs in a direction substantially parallel to the central axis.

6. The apparatus of claim 5, wherein the central axis of each discrete flow tube is generally parallel to the reference plane of the microprocessor.

* * * * *